(12) United States Patent
Teppan et al.

(10) Patent No.: US 9,217,763 B2
(45) Date of Patent: Dec. 22, 2015

(54) MIXED MODE FLUXGATE CURRENT TRANSDUCER

(75) Inventors: Wolfram Teppan, Collonges-sous-Salève (FR); Hiroshi Obata, Yokosuka (JP); Yori Hatakeyama, Kanagawa (JP)

(73) Assignee: LEM Intellectual Property SA, Fribourg (CH)

( * ) Notice: Subject to any disclaimer, the term of this patent is extended or adjusted under 35 U.S.C. 154(b) by 484 days.

(21) Appl. No.: 13/389,779

(22) PCT Filed: Aug. 10, 2010

(86) PCT No.: PCT/IB2010/053616
§ 371 (c)(1),
(2), (4) Date: Feb. 9, 2012

(87) PCT Pub. No.: WO2011/018754
PCT Pub. Date: Feb. 17, 2011

(65) Prior Publication Data
US 2012/0139527 A1  Jun. 7, 2012

(30) Foreign Application Priority Data
Aug. 11, 2009 (EP) ..................... 09167672

(51) Int. Cl.
*G01R 1/22* (2006.01)
*G01R 19/20* (2006.01)
*G01R 15/18* (2006.01)

(52) U.S. Cl.
CPC .............. *G01R 19/20* (2013.01); *G01R 15/185* (2013.01)

(58) Field of Classification Search
None
See application file for complete search history.

(56) References Cited

U.S. PATENT DOCUMENTS 6,043,640 A * 3/2000 Lauby et al. .................. 324/127
6,316,931 B1 * 11/2001 Nakagawa et al. ....... 324/117 R
6,566,855 B1 * 5/2003 Nguyen et al. ............ 324/117 R (Continued)

FOREIGN PATENT DOCUMENTS

EP        2251704 A1 * 11/2010  ............. G01R 33/04
JP       S5210514 A      1/1977

(Continued)

OTHER PUBLICATIONS

Roman et al., Low Consumption Flux-gate Transducer for AC and DC high-current Measurement, 2008, PESC 2008, IEEE, pp. 535-540.*

(Continued)

*Primary Examiner* — Melissa Koval
*Assistant Examiner* — Courtney McDonnough
(74) *Attorney, Agent, or Firm* — Faegre Baker Daniels LLP

(57) ABSTRACT

Electrical current transducer comprising a measuring circuit (6) and an inductor (4) for measuring a primary current $I_P$ flowing in a primary conductor (2), the inductor comprising a saturable magnetic core (10) made of a highly permeable magnetic material and a secondary coil (12) for carrying an alternating excitation i configured to alternatingly saturate the magnetic core, the coil being connected to the measuring circuit. The measuring circuit is configured to measure a mean value of the excitation current in the secondary coil and determine therefrom a value of the primary current for small current amplitudes, the measuring circuit being further configured for evaluating the frequency of the excitation current i and determining therefrom the value of the primary current for large currents.

15 Claims, 4 Drawing Sheets

(56) References Cited

U.S. PATENT DOCUMENTS 7,358,716 B2 * 4/2008 Preusse et al. ............ 324/117 R
7,541,799 B2 6/2009 Hausperger et al.

FOREIGN PATENT DOCUMENTS

| | | |
|---|---|---|
| JP | S60173475 A | 9/1985 |
| JP | S60183923 A | 9/1985 |

OTHER PUBLICATIONS

Ponjavic et al., Nonlinear Modeling of the Self-Oscillating Fluxgate Current Sensor, Nov. 2007, Sensors Journal, IEEE, vol. 7, No. 11, pp. 1546-1553.*

International Search Report and the Written Opinion issued by the European Patent Office, Rijswijk, Netherlands, dated Nov. 5, 2010, for related International Application No. PCT/IB2010/053616; 15 pages.

Ponjavic, Milan M., et al., "Nonlinear Sensors Modeling of the Self-Oscillating Fluxgate Current Sensor," *IEEE Sensors Journal*, vol. 7, No. 11, Nov. 2007; pp. 1546-1553.

Zeiliang, Xu, et al., "Type B RCD with a simplified magnetic modulation/demodulation method,",*Power Electronics and Motion Control Conference*, May 17-20, 2009; *IPEMC '09; IEEE 6$^{th}$ International*, Piscataway, NJ, USA; XP031484742; pp. 769-772.

Pross, A., et al., "A low cost analogue current transducer," *Sensors and Actuators A*, vol. 76, (Aug. 1999); XP004184414; pp. 72-77.

Tang, S.C., et al., "Excitation circuit for fluxgate sensor using saturable inductor," *Sensors and Actuators A*; vol. 113, Issue 2, (Jul. 2004); XP004515681; pp. 156-165; available at Internet address: www.sciencedirect.com.

Roman, Manuel, et al., "Low Consumption Flux-gate Transducer for AC and DC high-current Meausrement," *Power Electronics Specialists Conference*, Jun. 115, 2008, Piscataway, NJ, USA; XP031300027; pp. 535-540.

International Preliminary Report on Patentability issued by the International Bureau of WIPO dated Feb. 14, 2012, for PCT/IB2010/053616; 7 pages.

Pejovic, Predrag, A Simple Circuit for Direct Current Measurement Using a Transformer, IEEE Transactions on Circuits and Systems—E Fundamental Theory and Applications, vol. 45, No. 8, Aug. 1988, pp. 830-837.

* cited by examiner

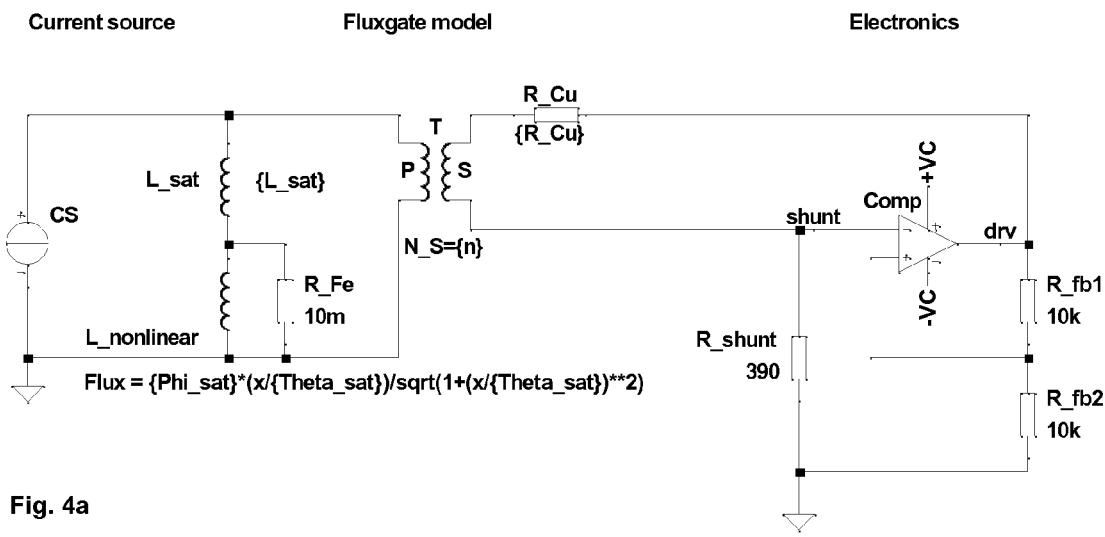
Fig. 4a
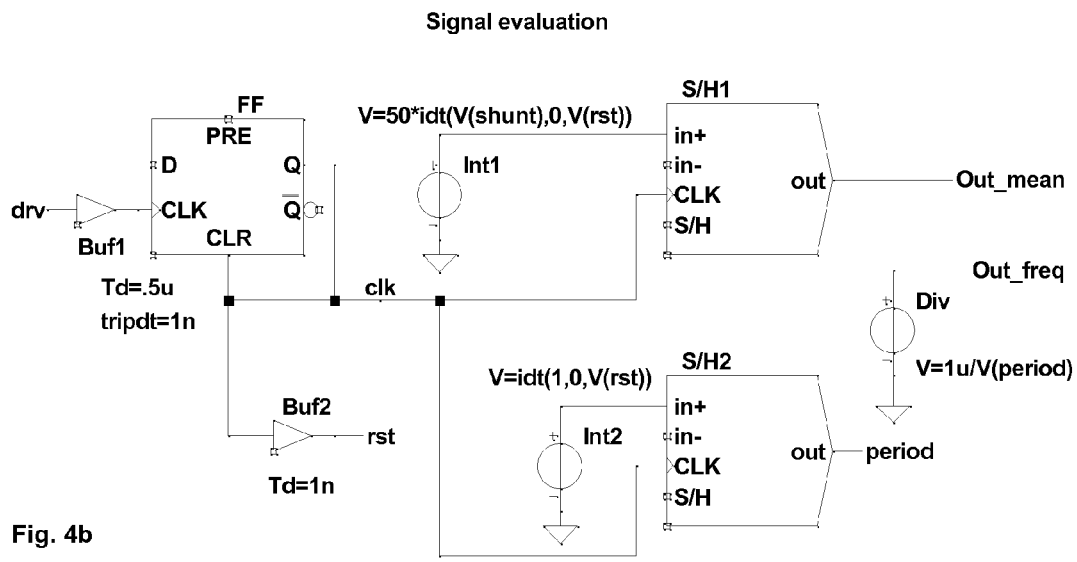
Fig. 4b
.tran 0 300m 10m uic
.Param n = 1000
.Param l_Fe = 64.5m
.Param A_Fe = 3.535u
.Param B_sat = 0.77
.Param H_sat = 10
.Param Phi_sat = B_sat * A_Fe
.Param Theta_sat = H_sat * l_Fe
.Param l_turn = 4m
.Param w_turn = 4m
.Param L_sat = 4e-7 * pi * l_turn * w_turn / l_Fe
.Param R_Cu_ = 0.3
.Param R_Cu = R_Cu_ * n * 2 * (l_turn + w_turn)
Fig. 4c
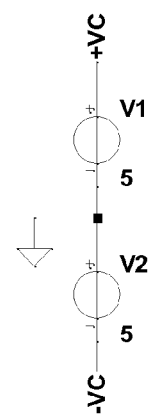

MIXED MODE FLUXGATE CURRENT TRANSDUCER

The present invention relates to a current transducer, in particular of the fluxgate type.

A conventional fluxgate current transducer typically comprises a core of a soft magnetic material of high magnetic permeability that is subjected to an alternating magnetic field by an excitation coil of the fluxgate. The magnetic field of the excitation coil saturates the core in an alternating manner. In the presence of a magnetic field, for example an external magnetic field generated by a current flowing in a primary conductor, the saturation characteristic of the soft magnetic core becomes (apparently, as seen from the secondary side) asymmetric and generates a corresponding signal in the circuit driving the fluxgate coil. The resulting signal is correlated to the amplitude of the external magnetic field. In a closed-loop current transducer, this signal is used in a feedback loop to drive a secondary coil on a magnetic circuit configured to cancel the effect of the magnetic field caused by the primary current linkage. The main advantage of closed-loop fluxgate transducers is their measurement stability and ability to accurately measure currents of small amplitude as well as a large dynamic range. However, such transducers are relatively expensive to build and are therefore not best suited for general, cost sensitive current measurement applications.

Certain applications require the measurement of a large range of currents at limited cost. An example of an application requiring the accurate measurement of small amplitude currents and a large measurement range, is monitoring of batteries. Battery monitoring may include measuring different parameters of a battery system, temperature, voltage, impedance and current, in order to evaluate the status (charge, health) of the battery [2]. Often it is necessary to monitor complex systems made of several hundreds of blocks, e.g. at industrial UPS, telecommunications systems, or battery storage systems. One of the difficulties concerning battery monitoring applications is the current measurement, where the measurement range (DC) may typically vary from 10 mA up to 1000 A. Today's available low cost current transducers are not well adapted to work with sufficient accuracy for the small amplitude currents while supporting the very large measurement range, which may vary from a few milliamperes of trickle charging (float) currents to several hundreds of amperes of battery discharge and recharge currents.

Certain electrical motors, generators and other electrical drives may also require the measurement of currents over a very large range for accurate and reliable control of the drive or generator.

An object of the invention is to provide a current transducer that accurately measures small currents, yet has a large measurement range.

It is advantageous to provide a current transducer that is economical to produce.

It is advantageous to provide a current transducer for battery monitoring that is accurate and economical to produce.

It is advantageous to provide a current transducer that is easy to implement.

It is advantageous to provide a current transducer that is compact and reliable.

Objects of the invention have been achieved by providing the mixed mode fluxgate transducer according to claim 1 and a current measuring method according to claim 10.

Disclosed herein is a fluxgate electrical current transducer comprising a measuring circuit and an inductor for measuring a primary current $I_P$ flowing in a primary conductor, the inductor comprising a saturable magnetic core made of a highly permeable magnetic material and a secondary coil connected to an auto-oscillating circuit of the measuring circuit for applying an alternating excitation current i configured to alternatingly saturate the magnetic core. The evaluation circuit is configured to measure the mean value of the excitation current i and determine therefrom a value of the primary current for small current amplitudes, the evaluation circuit being further configured for measuring the frequency of the excitation current i and determining therefrom the value of the primary current for large currents.

The current transducer preferably has a measuring circuit including a bipolar DC voltage source $V_C$, a means to connect this voltage source in alternatingly one or the other polarity to the saturable inductor, a means to detect a threshold of the current flowing through the inductor influencing the connection means, a circuit measuring the mean (average) value of this current, a circuit measuring the frequency of the oscillation, a means to linearize and combine those measured values and an output circuit to communicate the calculated value of the primary current. The means for connecting the voltage source to the saturable inductor and the current threshold detector may be a comparator circuit. The average value measuring circuit may comprise a low pass filter and an analog-to-digital converter. The circuit measuring the frequency of the oscillation may be configured to carry out frequency measurement by counting periods of a known frequency during a switching period of the voltage connecting means. The means to linearize and combine the signals may be a system with a digital-to-analog converter and/or a digital interface. The measuring circuit may comprise a resistance $R_m$ to measure the excitation current.

The current transducer may further include a microcontroller to which the measuring circuit is connected, the microcontroller comprising one or more of the following blocks in addition to numerical processing units: an analog-to-digital converter, a voltage reference, a counter for time (period) measurements, a digital-to-analog converter, a digital output.

A method of measuring an electrical current flowing in a primary conductor according to this invention includes:
- providing a current transducer including a measuring circuit having an auto-oscillating excitation circuit, and an inductor, the inductor comprising a secondary coil wound around a saturable magnetic core,
- applying an excitation voltage to the secondary coil configured to alternatingly saturate the magnetic core,
- measuring the mean value of the excitation current i and determining therefrom a value of the primary current for small primary current amplitudes, and
- measuring the frequency of the auto-oscillating circuit driving the excitation current flowing through the inductor and determining therefrom a value of the primary current for large primary current amplitudes.

For primary currents in a transition region around the value i=0 the output value may be calculated as a function of both the average value of the excitation current and the oscillation frequency.

The current transducer according to this invention, which is based on a technology of type "fluxgate", is economical to produce and implement yet has a wide measurement range while providing sufficient accuracy. The transducer uses the magnetic field created by a primary current acting on a saturable inductor. At low primary current amplitudes, the average value of the excitation current flowing in the secondary coil produces an average magnetic field that tends to cancel the magnetic field generated by the primary current, so that the average value of the alternating excitation current is correlated to the average value of the primary current. For large primary currents, the magnetic core does not de-saturate completely between the changes in excitation current direction such that the average value of the alternating excitation current is no longer correlated to the primary current. For large primary currents, the excitation frequency of the alternating excitation current, which is correlated to the primary current, is measured and, making use of a suitable microcontroller, it is thus possible to accurately evaluate the value of the primary current for both high and low current levels over a very large measurement range.

For primary currents $I_P$ that are small, the primary current value may be determined based on a value of the average value of the excitation current flowing in the secondary coil.

The measuring method for small currents is preferably employed for primary currents respecting the following condition:

$$\left|\frac{I_P}{N}\right| < i_{s0}$$

where $I_P$ is primary current, N the number of turns of the secondary coil, and $i_{s0}$ the amplitude of the excitation current that saturates the magnetic core for a primary current that is 0.

For large primary currents the measurement of the primary current is based on an evaluation of the excitation frequency of the auto-oscillation circuit driving the alternating excitation current i in the secondary coil.

Further objects and advantageous features of the invention will be apparent from the claims and the following detailed description of embodiments of the invention and the annexed drawings in which:

FIG. 4a illustrates a circuit diagram of simulation model of a fluxgate current transducer according to an embodiment of this invention, whereby a current source is connected to the equivalent electrical schematics of a fluxgate transducer and to an electronic measuring circuit;

FIG. 4b is functional block diagram of a simulation model of an exemplary measuring circuit according to the invention for evaluating the mean value of the current flowing through the fluxgate and its oscillating frequency;

FIG. 4c illustrates the geometrical and magnetic parameters of the simulation model and the voltage sources needed for an electronic comparator;

FIG. 6b is a magnification of FIG. 6a;

FIG. 6c is another magnified view of FIG. 6a;

Figure 1:
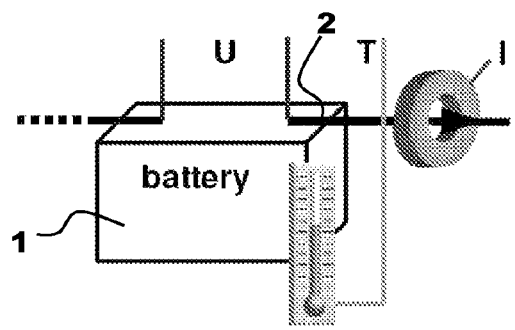
FIG. 1 is a simplified illustration of a battery monitoring system indicating the measured parameters.
Figure 2:
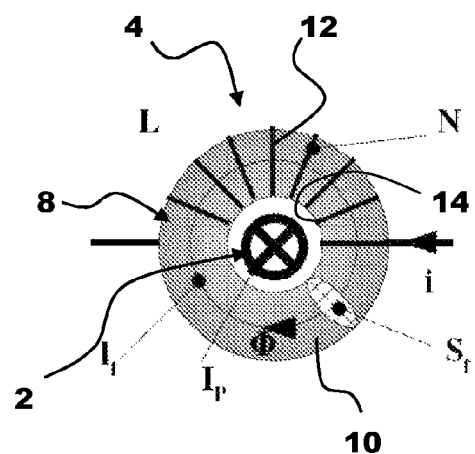
FIG. 2 illustrates a saturable inductor of a current transducer according to an embodiment of this invention and its main parameters.
Figure 7:
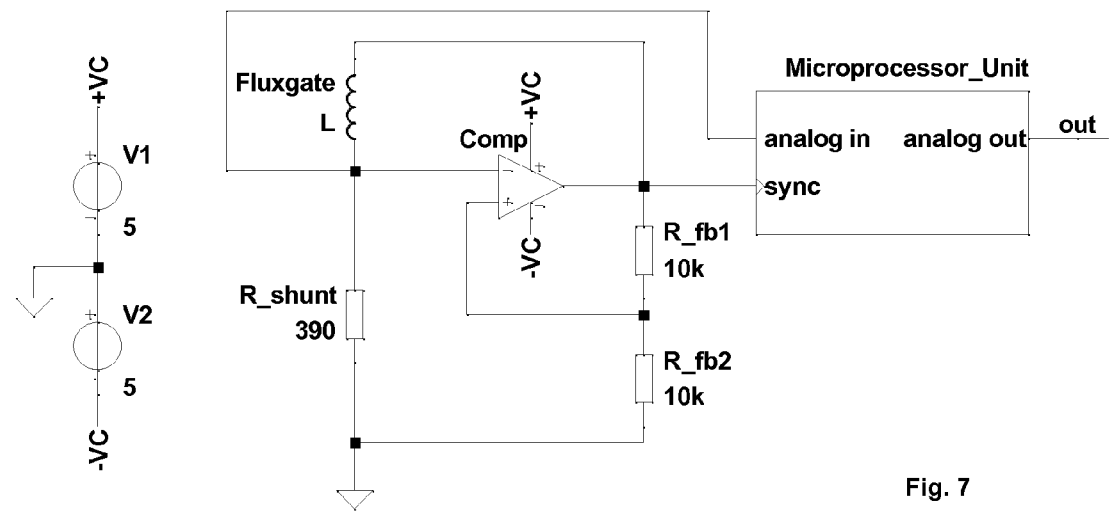
FIG. 7 illustrates a circuit diagram of an embodiment of a measuring circuit of a current transducer according to this invention.

Referring to FIGS. 1, 2 and 7, an embodiment of a current transducer according to this invention, for measuring a primary current $I_P$ flowing in a primary conductor 2, for example connected to a battery 1 or other electrical device or motor, the primary current corresponding to the charge or discharge current of the battery, or a drive current of an electrical motor. The transducer comprises an inductor 4 (representing an inductance L) connected to a measuring circuit 6. The inductor comprises a magnetic circuit 8 comprising a magnetic core 10 made of a high magnetic permeability material (soft magnetic material), and a secondary coil (also called herein excitation coil) 12 wound around at least a portion of the saturable magnetic core 10. The secondary coil 12 is connected to the measuring circuit 6 which feeds an excitation current +i, −i through the secondary coil, the excitation current being configured to alternatingly saturate the magnetic core in one direction and then in the opposed direction. In the embodiment shown, the magnetic core is in the form of an annular closed ring having a central passage 14 through which the primary conductor extends.

The primary conductor is shown as a single conductor passing straight through the central passage of the magnetic core, however it is also possible to have a primary conductor with one or more turns (windings) around a portion of the saturable core. The portion of primary conductor may be integrated to the current transducer and comprises connection terminals for connection to an external primary conductor of the system to be measured. The primary conductor may also be separate from the transducer and inserted through the transducer. The magnetic core may have other shapes than circular, for example rectangular, square, polygonal or other shapes. Moreover, the magnetic core of the inductor may also form a non-closed circuit, for example in the form of a bar or an almost closed magnetic core with an air gap. The magnetic core may also be formed of more than one part, for example of two halves or two parts that are assembled together around the primary conductor. Also, the current transducer may comprise a magnetic core that does not have a central passage through which the primary conductor extends whereby the primary conductor can be positioned in proximity of the magnetic core or wound around in one or more turns around a portion of the magnetic core. In these various configurations, the functioning principle remains essentially the same whereby the excitation in the secondary coil is an alternating current that saturates the magnetic core in alternating directions, and where the primary current generates a magnetic field that affects the apparent saturation characteristic of the magnetic core.

In the present invention, for small currents the measuring circuit measures the average value of the excitation current, which is essentially proportional to the amplitude of the primary current. For large primary currents however, this measuring principle is no longer employed because the core is saturated without any secondary (excitation) current and the average value of the secondary current no longer mirrors the primary current. For high currents the measuring circuit thus employs another measurement method, this method comprising evaluating the frequency of the secondary coil excitation current which corresponds to the amplitude of the primary current as described in more detail hereafter.

Advantageously, a single, simple and low cost transducer can thus be used for measuring a very large current range.

FIGS. 1 and 2 illustrate parameters of a battery monitoring system with a closed-loop current transducer, where:

N is the number of secondary turns
$I_{Fe}$ is the average magnetic circuit length
$S_{Fe}$ is the magnetic circuit cross section i is the excitation current
$I_P$ is the primary current (to be measured), and
$\phi$ is the magnetic flux.

The main difficulty in this type of application is the measurement of the current, because it can vary in a very large range, from the few milliamperes of the trickle charging (float) currents to the several hundreds of ampere of the battery discharge and recharge currents.

FIG. 4a shows a current source CS connected to the equivalent electrical schematics of a fluxgate transducer (fluxgate model) and to an electronic measuring circuit. The current source provides a monotonously increasing current for the simulation with a form adapted to the big dynamic range of the fluxgate oscillation frequency. The fluxgate model consists of a saturable inductivity L_nonlinear with a sigmoid function $\psi(i)$ (flux linkage vs. current) of the type $i/\sqrt{(1+i^2)}$, a constant inductivity L_sat representing the remaining inductance of the fluxgate when the core is completely saturated, a resistance R_Fe that represents dynamic losses of the magnetic material, an ideal transformer T with the number of secondary turns n (primary turn count is one), and a resistance representing the copper losses of the secondary winding.

The electronic circuit that feeds the secondary current to the fluxgate is a very simple auto-oscillating arrangement consisting of an electronic comparator comp, a resistance R_shunt that measures the secondary current flowing in the fluxgate winding and a voltage divider (R_fb1, R_fb2) that feeds back a portion of the output voltage of the comparator.

This arrangement shows the basic behavior that allows this circuit to be used as a current transducer with a wide dynamic range.

FIG. 4b shows an assembly of blocks that evaluates the mean value of the current flowing through the fluxgate and its oscillating frequency.

The signals Out_mean and Out_freq provide this information.

Out_mean is calculated as the integral (Int1)) over every switching period of the fluxgate current (the voltage measured at R_shunt), sampled with S/H1.

Out_freq is calculated as the reciprocal value (Div) of each switching period which is determined by integrating a constant during this period (Int2), sampled with S/H2. The flip-flop FF and the Buffer buf2 generate short pulses at the end of every switching period to gate the sample-and-hold circuits S/H1 and S/H2 and to reset the integrators.

These functions can in a practical device be realized with electronic components such as operational amplifiers, resistors, capacitors, analog-to-digital converters and a microprocessor with its firmware.

FIG. 4c shows simply a block of the simulation model where the geometrical and magnetic parameters of an exemplar toroidal fluxgate are defined and the voltage sources needed for the electronic comparator.

FIGS. 5a, 5b and 6a-6c show that the circuit can produce signals that are an image of a primary current with a large dynamic range.

Figure 5A:
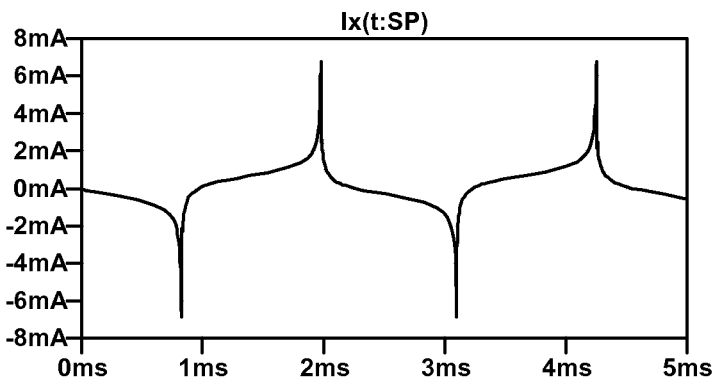
FIG. 5a is a graph illustrating the current flowing in the secondary fluxgate winding when the primary current is small.
Figure 5B:
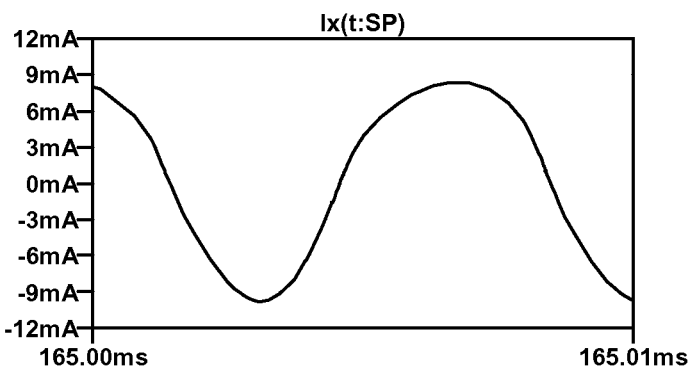
FIG. 5b is a graph illustrating the switching frequency of the current flowing in the secondary fluxgate winding when the primary current is large.

FIG. 5a shows the current flowing in the secondary fluxgate winding at the beginning of the simulation, when the primary current is small. The switching frequency in this simulation is below 500 Hz. When the primary current reaches high values that cannot be evaluated with the standard method (mean value calculation), the frequency has reached a high value of more than 100 kHz as shown in FIG. 5b.

Figure 3:
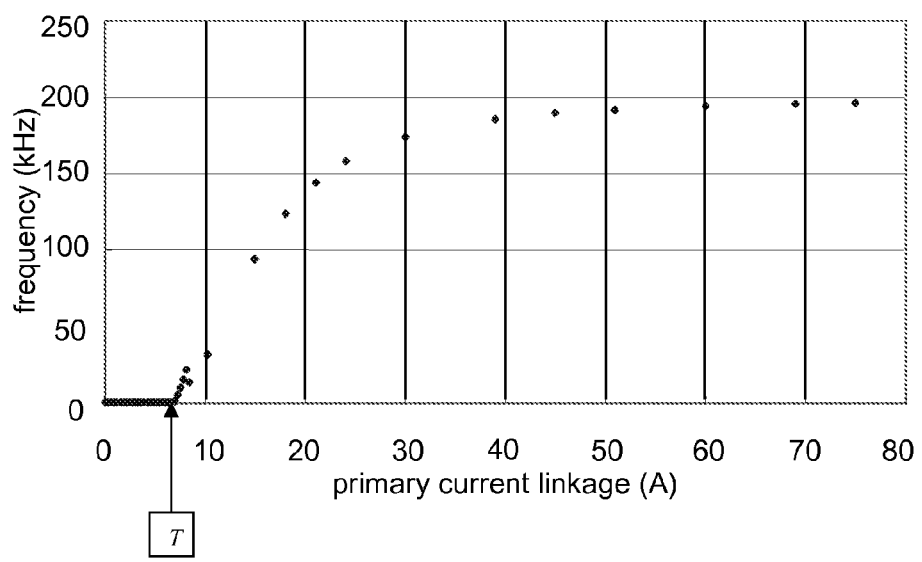
FIG. 3 is a graph illustrating measured values of the frequency variation of the current in the secondary (i.e. excitation) coil as a function of the primary current.

FIG. 3 is shows measured values of the frequency variation of the current in the secondary (i.e. excitation) coil as a function of the primary current, in a test prototype, whereby for currents superior to approximately 7 amperes it can be seen that the frequency of the secondary coil varies measurably with an increase in the primary current. In this example, the measuring mode for primary currents below the transition point T is thus configured for low current measurement, whereas after the transition point the measuring mode is configured for high current measurement based on an evaluation of the secondary circuit excitation frequency.

Figure 6A:
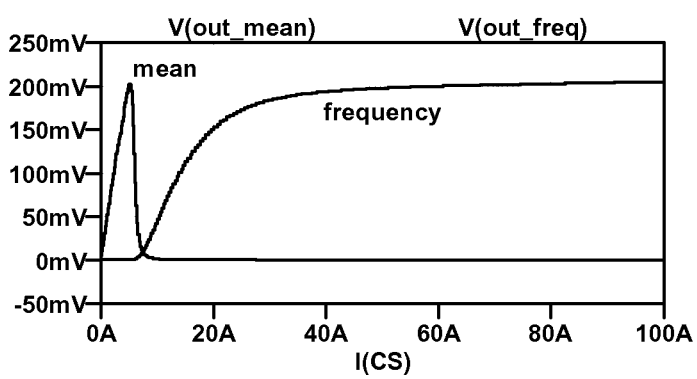
FIG. 6a is a graph illustrating two output signals of the circuit vs. the primary current.
Figure 6B:
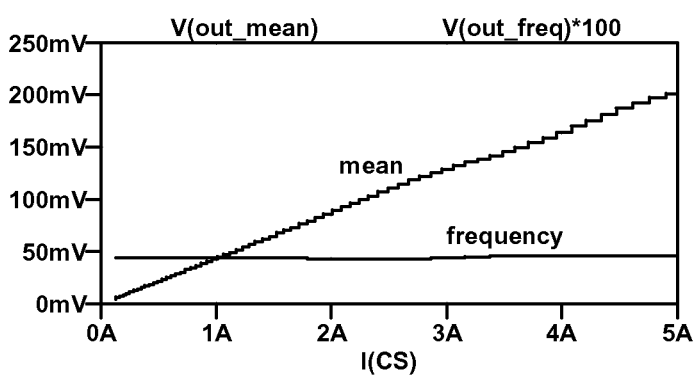
Figure 6C:
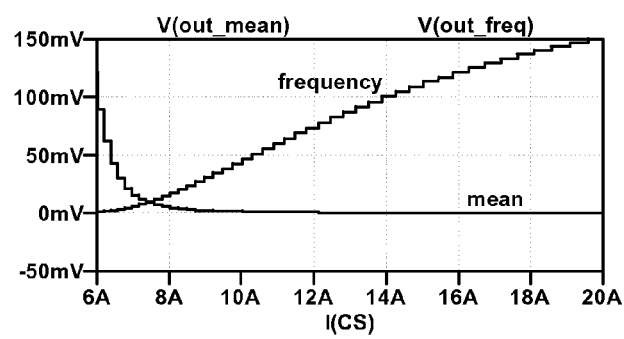

FIG. 6a shows the two output signals of the circuit vs. the primary current: for small currents, the output frequency stays nearly constant and the mean value of the current increases, at primary currents over 10 A this mean value has fallen again to very low values that cannot be used without more information to determine the primary current because the values are ambiguous and are also present at small primary currents. With the help of the switching frequency that increases for primary currents greater than about 5 A, the ambiguity can be resolved. FIG. 6b is a magnification of FIG. 6a, where it becomes evident that the switching frequency stays relatively constant for small primary currents. FIG. 6c is another magnified view of FIG. 6a, where the current range is shown in that the frequency measurement will give the best results. For currents lower than approximately 7 A a combined evaluation of mean secondary current value and frequency may be used, at higher currents than about 20 A the frequency increase becomes smaller and smaller, and the measuring accuracy will be influenced by parameter variations, for example due to temperature variations.

Measuring Circuit

FIG. 7 illustrates a measuring circuit schematic of an embodiment of a transducer according to this invention. The current to be measured is the primary current of a current transformer built with a suitable toroidal core. The secondary (measuring) circuit is made of a DC voltage source $V_C$=12 V, supplying the fluxgate. The blocks of FIG. 4b are replaced by a microprocessor unit with an integrated analog-to-digital converter and a digital synchronization input for timing purposes. For small primary currents, the microprocessor unit uses the (internally low-pass filtered) excitation current signal present at the resistor R_shunt; for large primary currents, a digital input is monitored that represents the oscillation frequency of the fluxgate circuit. For primary current values in the transition region, a combination of both signals can be used.

Measuring Method for Low Primary Currents

The mean (average) value of the current flowing through the secondary winding of the fluxgate is determined with the help of an analog low pass filter and an analog-to digital conversion or by oversampling and subsequent numerical low pass filtering. The analog filter can be a simple R-C circuit, an active filter or a gated integrator circuit synchronized to the switching period of the fluxgate. A numerical low-pass filter can also be synchronized to the switching period. The average value is then scaled to result in a value proportional to the input current. The above measuring method for small primary currents can be used for primary currents respecting the following condition:

$$\left|\frac{I_P}{N}\right| < i_{s0} \tag{22}$$

As an example, in a test prototype this condition means a measuring range (primary current) of ±7 A. For higher primary current values, a different measuring method is used.

Measuring Method for High Primary Currents

To determine the oscillation frequency of the fluxgate, the output signal of the comparator Comp is connected to a digital input of the microprocessor, if necessary via a voltage limiting network (not shown) that adapts the signal level to the one compatible with the microprocessor. The fastest method to determine the frequency of the fluxgate excitation signal is to count a number of (internal) clock cycles, e.g of the microprocessor itself, between two rising (or falling) edges of the "sync" input. The reciprocal value of the number of pulses that have been counted (many microprocessors provide internal units for this purpose) can then be multiplied by a constant to give the frequency in Hz. This frequency is a function of the input current, but not a linear one. Therefore, a function which is approximatively inverse to the function shown in FIG. 6a for the frequency signal is applied. Such an approximation can be calculated e.g. by piecewise linear interpolation, but many other algorithms are known.

According to the operating range, an output signal "out" is generated. This output signal may be an electrical quantity (voltage or current), but also a digital output with the values coded as frequency, duty cycle or any other digital interface like RS-485 or the like can be used. In the intermediate range, the output signal can be calculated as a function of both the mean value and the frequency.

The invention claimed is:

1. Electrical current transducer comprising a measuring, circuit and an inductor for measuring a primary current $I_p$ flowing in a primary conductor, the inductor comprising a saturable magnetic core made of a highly permeable magnetic material and a secondary coil connected to an auto-oscillating circuit of the measuring circuit for applying an alternating excitation current i configured to alternatingly saturate the magnetic core, wherein the measuring circuit is configured to measure an average value of the alternating excitation current i and determine therefrom a value of the primary current for small primary current amplitudes, said small primary current amplitudes being in a first range extending from a zero amplitude current to a transition current amplitude, the measuring circuit being further configured for evaluating the frequency of the excitation current i and determining therefrom the value of the primary current for large current amplitudes, said large primary current amplitudes being in a second range extending front the transition current amplitude to a primary current amplitude larger than the transition current amplitude, the first range and the second range being non-overlapping ranges.

2. Electrical current transducer according to claim 1, wherein the measuring circuit includes a bipolar DC voltage source $V_c$, a means to connect this voltage source in alternatingly one or the other polarity to the saturable inductor, a means to detect a threshold of the current flowing through the inductor influencing the connection means, a circuit measuring the mean (average) value of this current, a circuit measuring the frequency of the oscillation, a means to linearize and combine those measured values and an output circuit to communicate the calculated value of the primary current.

3. Electrical current transducer according to claim 2, wherein the means for connecting the voltage source to the saturable inductor and the current threshold detector is a comparator circuit.

4. Electrical current transducer according to claim 2, wherein the average value measuring circuit comprises a low pass filter and an analog-to-digital converter.

5. Electrical current transducer according to claim 2, wherein the circuit measuring the frequency of the ostillation is configured to carry out frequency measurement by counting periods of it known frequency during a switching period of the voltage connecting means.

6. Electrical current transducer according to claim 2, wherein the means to linearize and combine the signals is a system with a digital-to-analog converter and/or a digital interface.

7. Electrical current transducer according to claim 2, wherein the measuring circuit comprises a resistance $R_m$ to measure the excitation current.

8. Electrical current transducer according to claim 1, wherein the saturable magnetic core is annular and closed.

9. Electrical current transducer according to claim 1, further including a microcontroller to which the measuring circuit is connected, the microcontroller comprising one or more of the following blocks in addition to numerical processing units: an analog-to-digital converter, a voltage reference, a counter for time (period) measurements, a digital-to-analog converter, a digital output.

10. A method of measuring an electrical current flowing in a primary conductor includes:
providing a current transducer including a measuring circuit having an auto:-oscillating excitation circuit, and an inductor, the inductor comprising a secondary coil wound around a saturable magnetic core,
applying an excitation voltage to the secondary coil configured to alternatingly saturate the magnetic core,
measuring an average value of the alternating excitation current i and determining therefrom a value of the primary current for small primary current amplitudes in a first range extending from a zero amplitude current to a transition current amplitude, and
measuring the frequency of the auto-osillating circuit driving the excitation current flowing through the inductor and determining therefrom a value of the primary current for large primary current amplitude in a second range extending from the transition current amplitude to a primary current amplitude larger than the transition current amplitude, the first range and the second range being non-overlapping ranges.

11. Method according to claim 10, wherein for small primary currents the measurement of the primary current is based on an evaluation of the average value of the excitation current.

12. Measuring method according to claim 10, wherein the measuring method for small currents is employed for primary currents respecting the following condition:

$$\left|\frac{I_p}{N}\right| < i_{s0}$$

where $I_p$ is primary current, N the number of turns of the secondary coil, and $i_{s0}$ the value of the saturation excitation current for a primary current that is 0.

13. Method according to claim 10, wherein for primary currents in a region around the alternating excitation current value i=0 the value of the primary current is calculated as a function of both the average value of the excitation current and the oscillation frequency.

14. Method according to claim 10, wherein the measuring circuit includes a bipolar DC voltage source $V_c$, a means to connect this voltage source in alternatingly one or the other polarity to the saturable inductor, a means to detect a threshold of the current flowing through the inductor influencing the connection means, a circuit measuring the mean (average) value of this current, a circuit measuring the frequency of the oscillation, a means to linearize and combine those measured values and an output circuit to communicate the calculated value of the primary current.

15. Electrical current transducer according to claim 1, wherein the small primary current amplitudes respect the following condition:

$$\left|\frac{I_P}{N}\right| < i_{s0}$$

where $I_p$ is primary current, N the number of turns of the secondary coil, and $i_{s0}$ the value of the saturation excitation current for a primary current that is 0.

* * * * *

UNITED STATES PATENT AND TRADEMARK OFFICE
CERTIFICATE OF CORRECTION

PATENT NO.         : 9,217,763 B2
APPLICATION NO.    : 13/389779
DATED              : December 22, 2015
INVENTOR(S)        : Wolfram Teppan et al.

It is certified that error appears in the above-identified patent and that said Letters Patent is hereby corrected as shown below:

In the Claims:

In Claim 1, Column 7, line 44, replace the word "front" with the word "from"

In Claim 5, Column 7, line 66, replace the word "ostillation" with the word "oscillation"

In Claim 5, Column 8, line 1, replace the word "it" with the word "a"

In Claim 10, Column 8, line 23, replace the word "auto:-oscillating" with the word "auto-oscillating"

In Claim 10, Column 8, line 33, replace the word "auto-osillating" with the word "auto-oscillating"

In Claim 10, Column 8, line 36, replace the word "amplitude" with the word "amplitudes"

Signed and Sealed this
Twenty-third Day of August, 2016

Michelle K. Lee
*Director of the United States Patent and Trademark Office*